(12) United States Patent
Lee

(10) Patent No.: US 6,452,210 B2
(45) Date of Patent: Sep. 17, 2002

(54) THIN FILM TRANSISTOR SUBSTRATE AND FABRICATING METHOD THEREOF

(75) Inventor: Hyun Kyu Lee, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 8 days.

(21) Appl. No.: 09/739,823

(22) Filed: Dec. 20, 2000

(30) Foreign Application Priority Data

Dec. 31, 1999 (KR) .............................. 99-68077

(51) Int. Cl.[7] ...................... H01L 29/04; H01L 31/036; H01L 31/0376; H01L 31/20
(52) U.S. Cl. .................. 257/59; 257/72; 349/43; 349/46; 349/106
(58) Field of Search ................. 257/59, 72; 349/41, 349/42, 43, 46, 106

(56) References Cited

U.S. PATENT DOCUMENTS 5,085,973 A * 2/1992 Shimizu ................ 430/271
5,757,451 A * 5/1998 Miyazaka et al. .......... 349/106
6,023,307 A * 2/2000 Park .......................... 349/24

* cited by examiner

*Primary Examiner*—Nathan J. Flynn
*Assistant Examiner*—Victor A. Mandala, Jr.
(74) *Attorney, Agent, or Firm*—Birch, Stewart, Kolasch & Birch, LLP

(57) ABSTRACT

A thin film transistor substrate having a structure in which a thin film transistor array is formed on color filters. In the substrate, a thin film transistor is formed on the color filters. A smoothing layer compensates for step coverage between the color filters and is provided with a recess in which a gate electrode of the thin film transistor is to be formed. Accordingly, step coverage in the gate electrode is eliminated, so that it becomes possible to manufacture a large-dimension panel without a limitation to the thickness and profile of the gate electrode.

2 Claims, 2 Drawing Sheets

THIN FILM TRANSISTOR SUBSTRATE AND FABRICATING METHOD THEREOF

BACKGROUND OF THE INVENTION

1. Field of the Invention

This invention relates to a thin film transistor substrate, and more particularly to a thin film transistor substrate that has a structure in which a thin film transistor array is formed on color filters. Also, the present invention is directed to a method of fabricating such a thin film transistor substrate.

2. Description of the Related Art

Generally, in a liquid crystal display (LCD) having a thin film transistor array provided on color filters, a thin film transistor substrate includes color filters formed on a transparent substrate; and switching devices of thin film transistors (TFT's) consisting of gate electrodes, a gate insulating film, an active layer, an ohmic contact layer and source and drain electrodes, and pixel electrodes, each of which is provided on the color filters.

FIG. 1 is a section view showing a structure of a conventional thin film transistor substrate having a thin film transistor array provided on color filters. Referring to FIG. 1, the thin film transistor substrate includes a black matrix 4 formed in a lattice shape on a transparent substrate 2 to divide the substrate 2 into a plurality cell areas in which color filter is to be formed and to prevent a color interference between the cell areas. On the transparent substrate 2 divided into cell units by means of the black matrix 4, red, green and blue color filters 6 for transmitting the respective red, green and blue color lights are provided. The color filters 6 are made from an acrylic or polyimide resin dispersed with pigments, and formed on the black matrix 4 to be separated from each other for the purpose of preventing a color mixture. On the surfaces of the color filters 6 is coated a smoothing layer 8 for preventing a contamination in the color filters 6 and for compensating for a step coverage or morphological difference between the red, green and blue color filters 6 formed separately to smooth the substrate. A gate electrode 10 is formed on the smoothing layer 8. The gate electrode 10 is formed by depositing a gate metal material, that is, any one of metal materials such as Al, Mo, Cr, Ta and an Al alloy or building a double layer of the metal materials on the smoothing layer 8 and thereafter patterning it. On the smoothing layer formed with the gate electrode 10, a gate insulating film 11 made from $SiN_x$ or $SiO_x$, etc. is provided. A semiconductor layer 12 and an ohmic contact layer 14 are formed by disposing amorphous silicon (a-Si) and amorphous silicon ($n^+$ a-Si) doped with an impurity on the gate insulating film 11 and then patterning it. Source and drain electrodes 16 and 18 are formed by depositing a metal such as Al, Mo, Cr, Ta or an Al alloy, etc. and then pattering it. A pixel electrode 22 is made by forming a protective film from a material of $SiN_x$ or $SiO_x$, etc. and a transparent electrode material (e.g., indium tin oxide (ITO)) and thereafter patterning them.

As described above, the conventional thin film transistor substrate inevitably requires the smoothing layer 8 so as to compensate for step coverage between the red, green and blue color filters 6. However, the smoothing layer 8 does not make a little effect to a step coverage removal in the thin film transistor formed at the upper portion of the smoothing layer 8. In the thin film transistor, a badness may occur at the layers (i.e., the semiconductor layer and the source and drain electrodes) disposed in the post process due to a step coverage in the gate electrode. Upon manufacturing of a large-dimension panel, it is necessary to form the gate electrode into a double metal layer for the sake of a good signal transmission. However, since a step coverage in the gate electrode is enlarged in the case of forming the gate electrode into a double metal layer, it becomes difficult to form a double layer of gate electrode and a material selection of the gate electrode is limited.

SUMMARY OF THE INVENTION

Accordingly, it is an object of the present invention to provide a thin film transistor substrate wherein a gate electrode is provided within a smoothing layer so as to compensate for step coverage in a thin film transistor.

A further object of the present invention is to provide a method of fabricating a thin film transistor substrate wherein a gate electrode is provided within a smoothing layer so as to compensate for step coverage in a thin film transistor.

In order to achieve these and other objects of the invention, a thin film transistor substrate according to one aspect of the present invention includes a thin film transistor formed on color filters; and a smoothing layer compensating for a step coverage between the color filters and being provided with a recess in which a gate electrode of the thin film transistor is to be formed.

A method of fabricating a thin film transistor substrate according to another aspect of the present invention includes the steps of forming color filters on a transparent substrate; forming a smoothing layer on the color filters and then pattering it to thereby define a recess in which a gate electrode of the thin film transistor is to be formed; and forming the thin film transistor on the smoothing layer.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Figure 1:
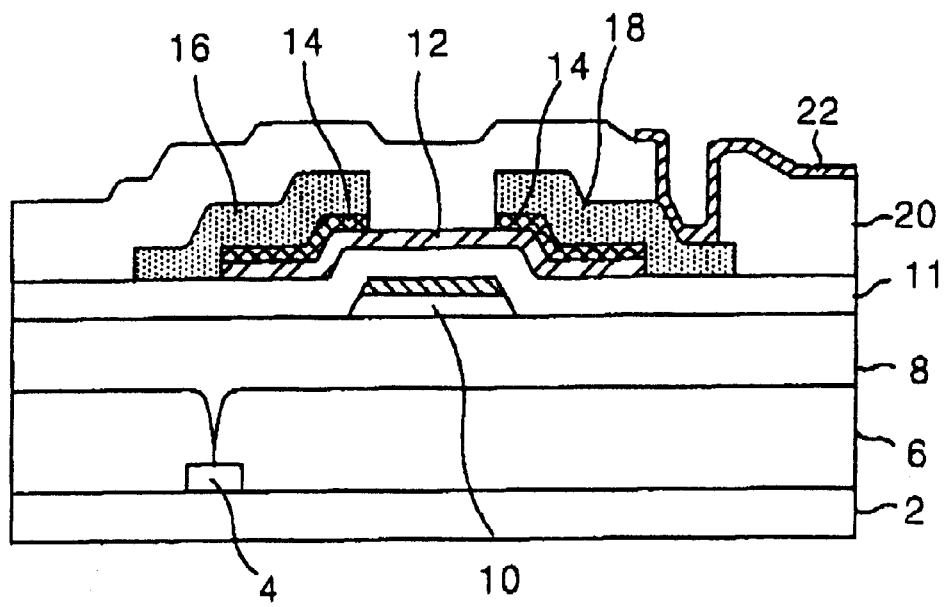
FIG. 1 is a section view showing a conventional thin film transistor substrate having a color filter on array structure.
Figure 2:
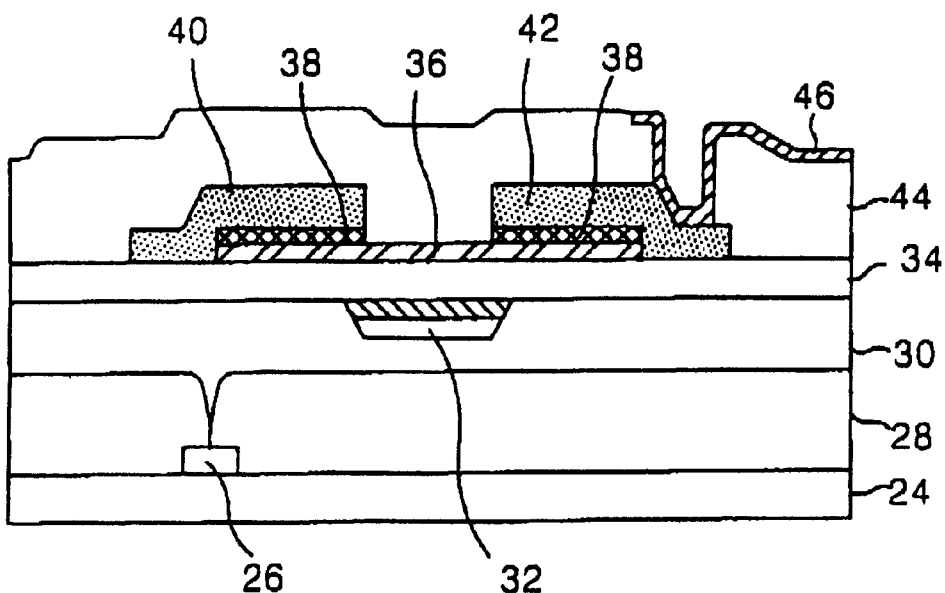
FIG. 2 is a section view showing a thin film transistor substrate having a color filter on array structure according to an embodiment of the present invention.

Referring to FIG. 2, there is shown a thin film transistor substrate according to an embodiment of the present invention in which a thin film transistor array is formed on color filters. The thin film transistor substrate includes a black matrix 26 and color filters 28 formed on a transparent substrate 24, a patterned smoothing layer 30 formed on the color filters 28, a gate electrode 32, a gate electrode 32 provided at the patterned portion of the smoothing layer 30, a thin film transistor consisting of a gate insulating film 34, a semiconductor layer 36, an ohmic contact layer 38 and source and drain electrodes 40 and 42, and a pixel electrodes 46. The smoothing layer 30 formed on the color filters 30 has a recess with the same size as the gate electrode 32 defined at a position where the gate electrode 32 is to be formed. The gate electrode 32 is formed in the recess of the smoothing layer 30. Thus, step coverage of the gate electrode 32 is eliminated. As a result, a limit to the thickness and profile of the gate electrode 32 is removed, so that it becomes not only easy to provide the gate electrode 32 having a double metal layer structure essential to a large-dimension panel, but also a wide selection for a material of the gate electrode 32 becomes possible.

Figure 3A:
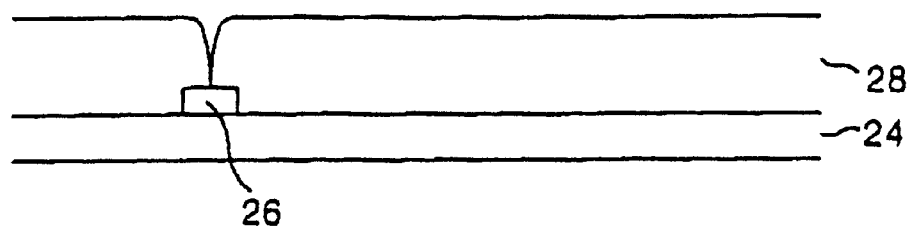
FIG. 3A to FIG. 3C are section views for explaining a method of fabricating the thin film transistor substrate shown in FIG. 3.
Figure 3B:
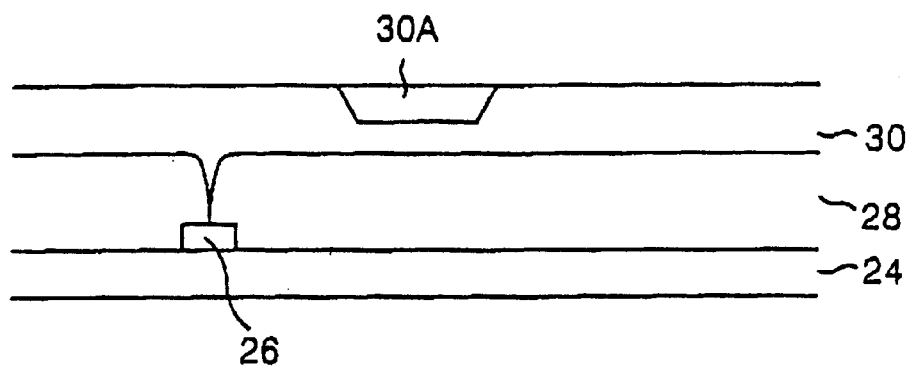
Figure 3C:
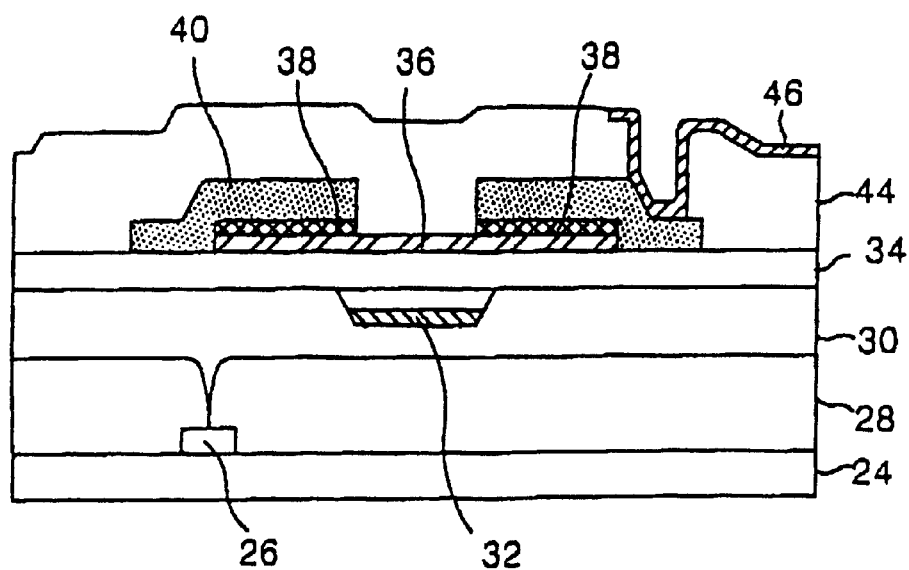

FIG. 3A to FIG. 3C explains a method of fabricating the thin film transistor substrate according to an embodiment of the present invention. Referring to FIG. 3A, the black matrix 36 and the color filter 28 are formed on the transparent substrate 24. the black matrix 36 is formed in a lattice shape on a transparent substrate 2 to divide the substrate 2 into a plurality cell areas in which color filter is to be formed and to prevent a color interference between the cell areas. On the transparent substrate 24 divided into cell units by means of the black matrix 26, red, green and blue color filters 28 are separately provided so as to transmit the respective red, green and blue color lights.

As shown in FIG. 3B, a smoothing layer 30 is coated on the color filters 28 so as to prevent a contamination in the color filters 28 and compensate for a step coverage or morphological difference between the red, green and blue color filters 28 formed separately. Then, a portion where the gate electrode is to be formed in the smoothing layer 30 is patterned to define a recess 30A having the same position and size as the gate electrode.

Subsequently, as shown in FIG. 3C, the thin film transistor consisting of the gate electrode 32, the gate insulating film 34, the semiconductor layer 36, the ohmic contact layer 38 and the source and drain electrodes 40 and 42, the protective film 44 and the pixel electrode 46 are formed on the smoothing layer 30. The gate electrode 32 is provided at the recess 30A of the smoothing layer 30. The gate electrode 32 is formed from any one of metal materials such as Al, Mo, Cr, Ta and an Al alloy, or a double layer of the metal materials. Thereafter, the semiconductor layer 36 and the ohmic contact layer 38 is formed by entirely coating the gate insulating film 34 made from $SiN_x$ or $SiO_x$, etc. thereon and by disposing an amorphous silicon (a-Si) and an amorphous silicon ($n^+$ a-Si) doped with an impurity on the gate insulating film 34 and then patterning it. The source and drain electrodes 40 and 42 are formed by depositing a metal such as Al, Mo, Cr, Ta or an Al alloy, etc. and then patterning it. The protective film 44 is formed from a material of $SiN_x$ or $SiO_x$, etc. over the entire substrate and then patterned to define a contact hole. A transparent electrode material (e.g., indium tin oxide (ITO)) is formed on the protective film 44 and then patterned to provide the pixel electrode 46, thereby completing the thin film transistor substrate. The pixel electrode 46 is electrically connected, via the contact hole, to the drain electrode 42.

As described above, according to the present invention, the gate electrode is formed in the recess defined by patterning the smoothing layer of the color filters to thereby eliminate step coverage in the gate electrode. Accordingly, a limit to the thickness and profile of the gate electrode 32 is removed, so that it becomes not only easy to provide the gate electrode 32 having a double metal layer structure essential to a large-dimension panel, but also a wide selection for a material of the gate electrode 32 becomes possible.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A thin film transistor substrate including color filters, comprising:

a thin film transistor formed on the color filters; and a smoothing layer compensating for a step coverage between the color filters and being provided with a recess in which a gate electrode of the thin film transistor is to be formed.

2. The thin film transistor substrate according to claim 1, wherein the recess of the smoothing layer has the same bulk as the gate electrode.

* * * * *